US009875936B1

(12) United States Patent
Sporer et al.

(10) Patent No.: US 9,875,936 B1
(45) Date of Patent: Jan. 23, 2018

(54) SPACER DEFINED FIN GROWTH AND DIFFERENTIAL FIN WIDTH

(71) Applicant: GLOBALFOUNDRIES Inc., Grand Cayman (KY)

(72) Inventors: Ryan Sporer, Mechanicville, NY (US); Rohit Pal, Mechanicville, NY (US); Jeremy Wahl, Delmar, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/348,109

(22) Filed: Nov. 10, 2016

(51) Int. Cl.

| | |
|---|---|
| ***H01L 29/66*** | (2006.01) |
| ***H01L 21/02*** | (2006.01) |
| ***H01L 21/304*** | (2006.01) |
| ***H01L 21/306*** | (2006.01) |
| ***H01L 21/308*** | (2006.01) |
| ***H01L 29/04*** | (2006.01) |
| ***H01L 29/06*** | (2006.01) |
| ***H01L 21/8234*** | (2006.01) |
| ***H01L 21/8238*** | (2006.01) |
| ***H01L 21/762*** | (2006.01) |
| ***H01L 21/3105*** | (2006.01) |
| ***H01L 27/088*** | (2006.01) |
| ***H01L 27/092*** | (2006.01) |

(52) U.S. Cl.
CPC ................ *H01L 21/823431* (2013.01); *H01L 21/31053* (2013.01); *H01L 21/76224* (2013.01); *H01L 21/823821* (2013.01); *H01L 27/0886* (2013.01); *H01L 27/0924* (2013.01); *H01L 29/6653* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 9,515,073 B1 * | 12/2016 | Jagannathan | ..... H01L 29/66545 |
| 2015/0372139 A1 | 12/2015 | Wei et al. | |
| 2016/0013273 A1 | 1/2016 | Zhang et al. | |

* cited by examiner

*Primary Examiner* — Khaja Ahmad

(74) *Attorney, Agent, or Firm* — Ditthavong & Steiner, P. C.

(57) ABSTRACT

Methods for forming fins with a straight profile by preventing fin bending during STI fill and annealing are disclosed. Embodiments include providing STI regions separated by Si regions, each topped with a hardmask; planarizing the STI regions; removing the hardmask over a portion of the Si regions, forming recesses; forming a conformal spacer layer over the STI regions and in the recesses; removing horizontal portions of the spacer layer; epitaxially growing Si in each recess, forming fins; and etching the STI regions and a remainder of the spacer layer down to the Si regions to reveal the fins.

11 Claims, 16 Drawing Sheets

107
107
103
101

109
109
107
107
103
101

SPACER DEFINED FIN GROWTH AND DIFFERENTIAL FIN WIDTH

TECHNICAL FIELD

The present disclosure relates to the manufacture of semiconductor devices, such as integrated circuits (ICs). The present disclosure is particularly applicable to forming and shaping fins, particularly for the 7 nanometer (nm) technology node and beyond.

BACKGROUND

Narrow fins (i.e., having a width of 6 to 8 nanometers (nm)) are susceptible to fin bending during the current shallow trench isolation (STI) oxide fill and anneal processes. Also, the current fin shaping process results in 7 nm fins having an undesirably tapered profile, and there is no available solution to create straight fins having such a narrow width.

A need therefore exists for methodology enabling formation of a straight fin profile and the resulting device.

SUMMARY

An aspect of the present disclosure is to form fins having a straight profile and uniform narrow width.

Another aspect of the present disclosure is to form fins having a straight profile and differential widths.

Another aspect of the present disclosure is a device having fins formed with a straight profile and a uniform narrow width.

A further aspect of the present disclosure is a device having fins formed with a straight profile and differential widths.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing STI regions separated by silicon (Si) regions, each topped with a hardmask; planarizing the STI regions; removing the hardmask over a portion of the Si regions, forming recesses; forming a conformal spacer layer over the STI regions and in the recesses; removing horizontal portions of the spacer layer; epitaxially growing Si in each recess, forming fins; and etching the STI regions and a remainder of the spacer layer down to the Si regions to reveal the fins.

Aspects of the present disclosure include planarizing the STI regions by chemical mechanical polishing (CMP). Another aspect includes the hardmask including silicon nitride (SiN). A further aspect includes the portion of the Si regions forming NFET and PFET regions. Other aspects include the hardmask having a width of 5 nm to 25 nm and a thickness of 20 nm to 60 nm. Another aspect includes forming the spacer layer to a thickness of 3 nm to 8 nm.

Another aspect include forming a mask over a second portion of the Si regions prior to removing the hardmask over the first portion of the Si regions; removing the mask over the second portion of the Si regions subsequent to removing the horizontal portions of the spacer layer, forming second recesses; epitaxially growing Si in the second recesses concurrently with epitaxially growing Si in the first recesses to form second fins; and etching the STI regions and a remainder of the spacer layer to reveal the first fins and the second fins. A further aspect includes the first portion of the Si regions forming portions of core (SG) devices and the second portion of the Si regions forming portions of input/output (EG) devices. Other aspects include the hardmask including SiN. Another aspect includes the hardmask having a width of 5 nm to 25 nm and a thickness of 20 nm to 60 nm. A further aspect includes forming the spacer layer to a thickness of 3 nm to 8 nm.

Another aspect of the present disclosure is a device including: a Si substrate; STI regions formed in the Si substrate; and epitaxially grown Si fins with uniform width formed on the Si substrate, between the STI regions, wherein the width of each fin is less than a distance between adjacent STI regions. Another aspect of the device includes each fin having a width of 2 nm to 17 nm, and the distance between adjacent STI regions is 5 nm to 25 nm. Other aspects include the epitaxially grown Si fins forming NFET and PFET regions.

A further aspect of the present disclosure is a device including: a Si substrate; STI regions formed in the Si substrate; and first epitaxially grown Si fins on a first portion of the Si substrate and second epitaxially grown Si fins on a second portion of the Si substrate, wherein a width of each first epitaxially grown Si fin is less than a width of each second epitaxially grown Si fin. Another aspect of the device includes each first epitaxially grown Si fin having a width of 5 nm to 12 nm. Further aspects include each second epitaxially grown Si fin having a width of 8 nm to 25 nm. Other aspects include each second epitaxially grown Si fin having a width equal to a distance between adjacent STI regions. Further aspects include the first epitaxially grown Si fins forming portions of core (SG) devices and the second epitaxially grown Si fins forming portions of input/output (EG) devices.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of fin bending attendant upon STI oxide fill and anneal processes. In accordance with embodiments of the present disclosure, the SiN hardmask is removed directly after STI CMP, thereby skipping the current STI deglaze process. The removal of the SiN hardmask forms an STI oxide defined trench for the fins. Spacers are formed on the sidewalls of the trench, and fins are grown in the reduced width trenches. As a result, narrow fins can be formed with a straight profile.

Methodology in accordance with embodiments of the present disclosure includes providing STI regions separated by Si regions, each topped with a hardmask. The hardmask over at least a portion of the Si regions is removed, forming recesses, and a conformal spacer layer is formed over the STI regions and in the recesses. Then, horizontal portions of the spacer layer are removed, and Si is epitaxially grown in each recess, forming fins. Subsequently, the STI regions and a remainder of the spacer layer are etched down to the Si regions to reveal the fins.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
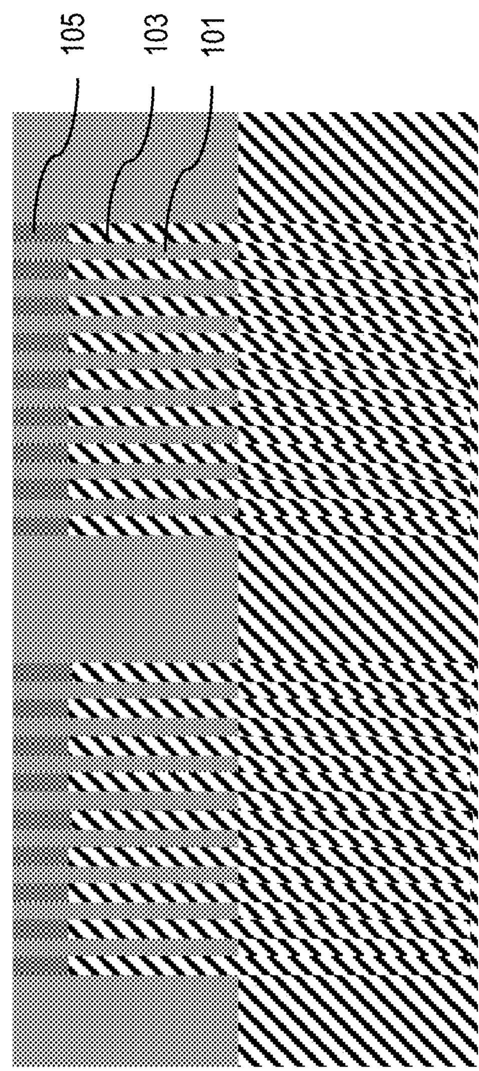
FIGS. 1A through 1F schematically illustrate a process flow for forming fins with a straight profile and uniform width, in accordance with an exemplary embodiment.
Figure 1B:
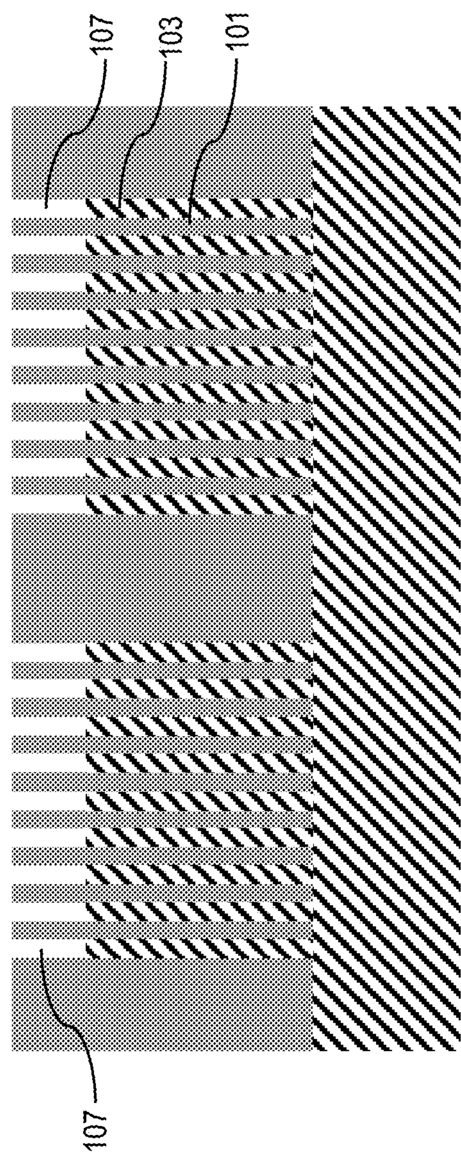
Figure 1C:
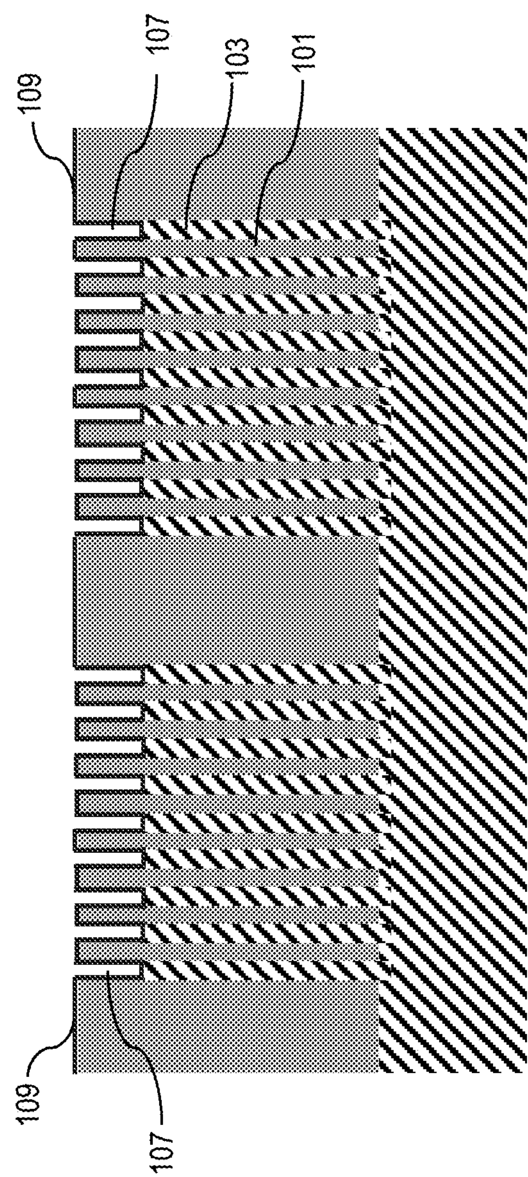
Figure 1D:
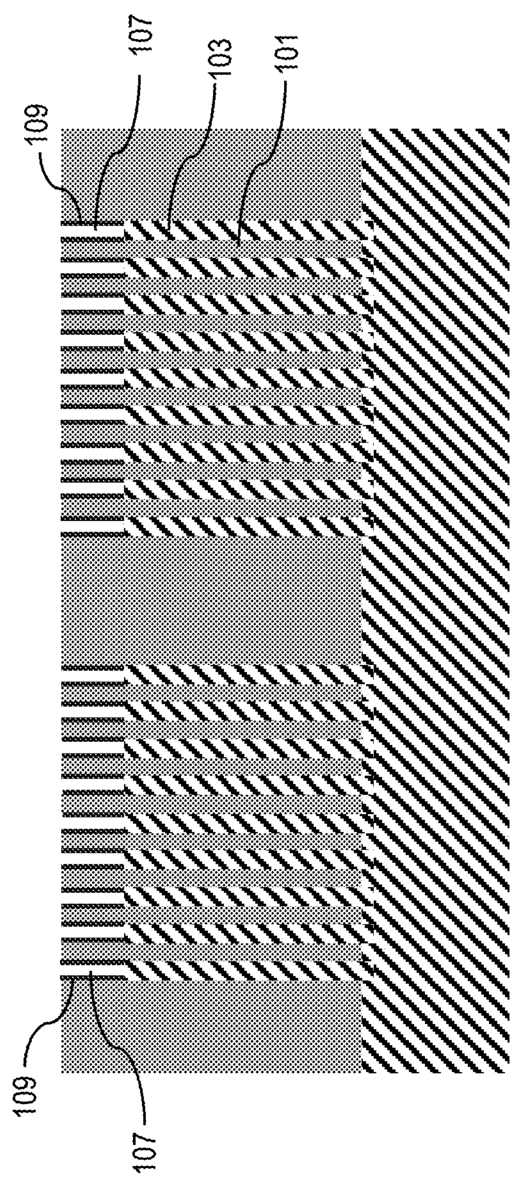
Figure 1E:
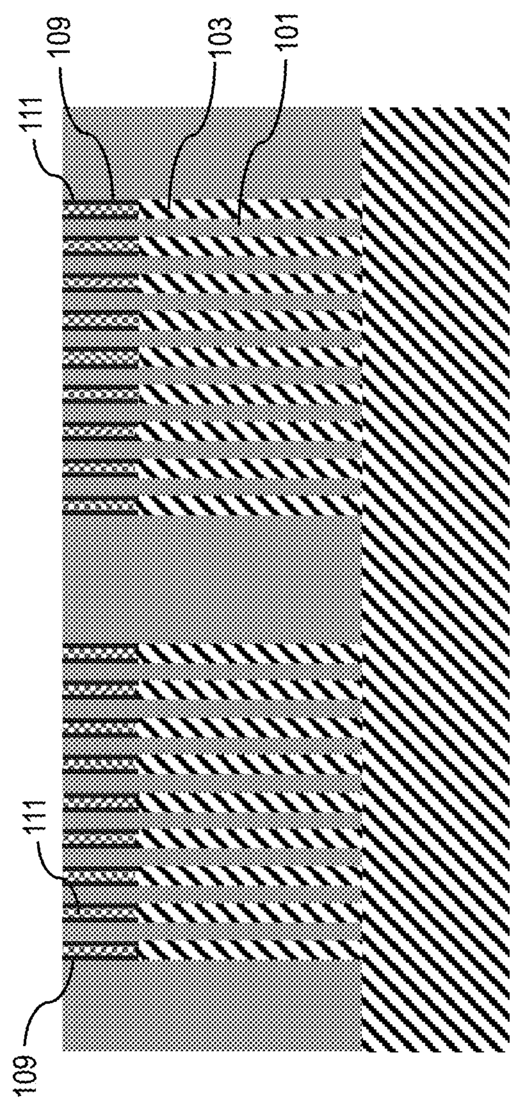
Figure 1F:
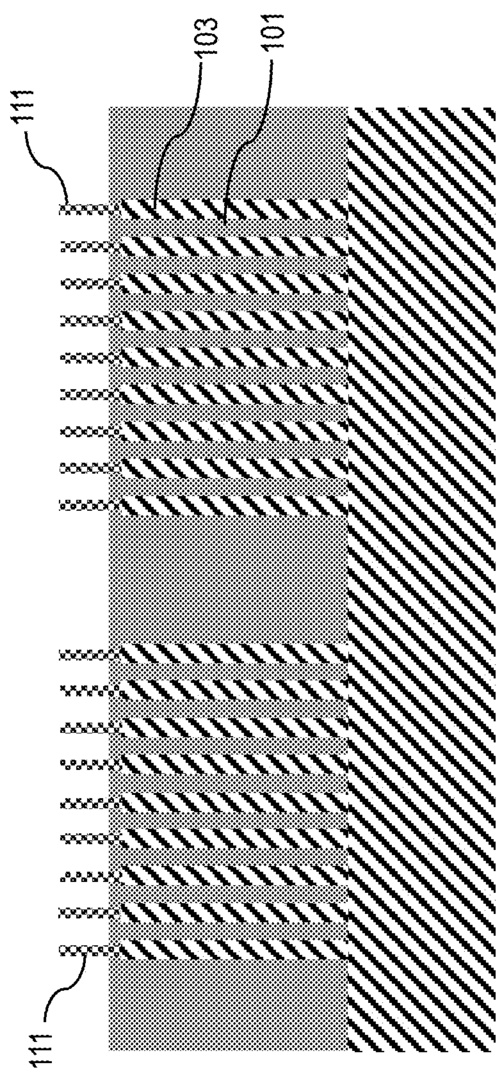

FIGS. 1A through 1F schematically illustrate a process flow for forming fins with a straight profile and uniform width, in accordance with an exemplary embodiment. Adverting to FIG. 1A, after STI CMP, STI regions 101 are separated by Si regions 103, each topped with a hardmask 105. The hardmask 105 is formed of SiN. The hardmask 105 has a width of 5 nm to 25 nm, defined by the fin pitch/width, and a thickness of 20 nm to 60 nm, depending on the patterning stack requirement. Next, as illustrated in FIG. 1B, the hardmask 105 over each of the Si regions 103 is removed, forming recesses 107. The hardmask 105 can be removed by any SiN removal process selective to oxide, for example, a dry etch or a $H_3PO_4$ etch. The Si regions 103 form NFET and PFET regions. Subsequently, a conformal spacer layer 109 is formed over the STI regions 101 and in the recesses 107 by atomic layer deposition (ALD) or in-situ radical assisted deposition (iRAD), as depicted in FIG. 1C. The spacer layer 109 is formed to a thickness of 3 nm to 8 nm, dependent on the desired amount of fin reduction. Then, as illustrated in FIG. 1D, horizontal portions of the spacer layer 109 are removed by a dry etch. The dry etch is anisotropic to preserve the sidewall thickness while removing the horizontal portions of the spacer layer 109. Next, Si is epitaxially grown in each recess 107 to form fins 111, as depicted in FIG. 1E. As illustrated in FIG. 1F, the STI regions 101 and a remainder of the spacer layer 109 are then etched down to the Si regions 103 by wet etching with HF, dry etching, SiCoNi™ etching, or a chemical oxide removal (COR) process to reveal the fins 111.

Figure 2A:
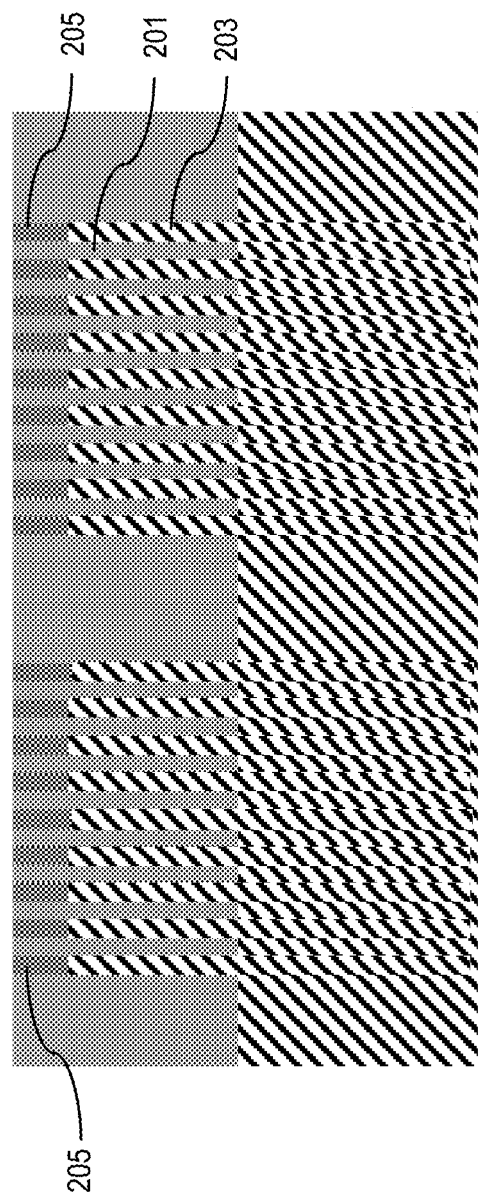
FIGS. 2A through 2J schematically illustrate a process flow for forming SG fins and EG fins having differential widths and a straight profile, in accordance with an exemplary embodiment.
Figure 2B:
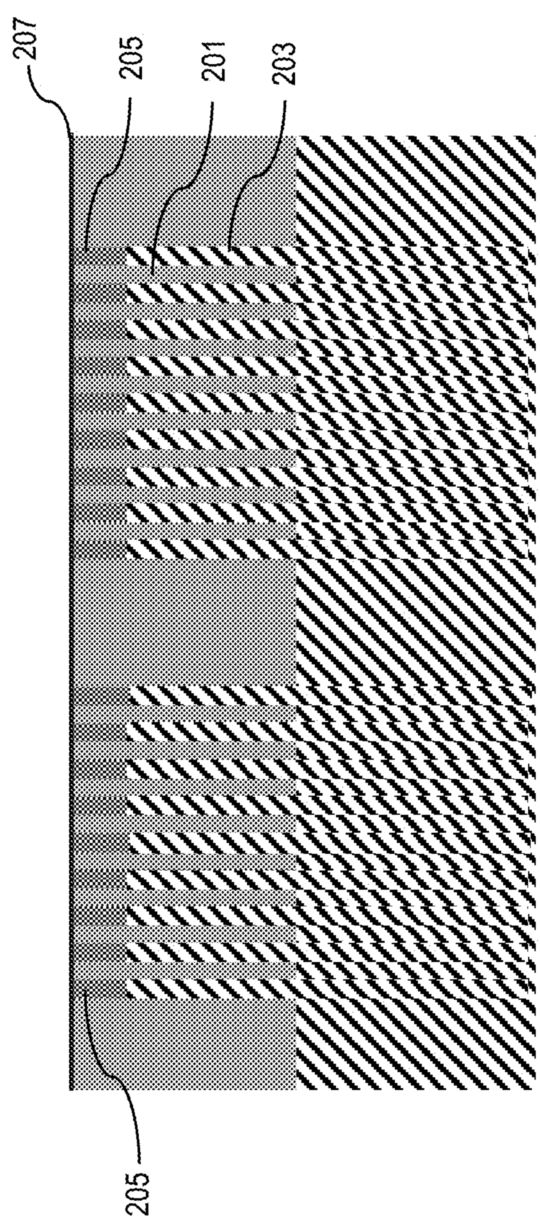
Figure 2C:
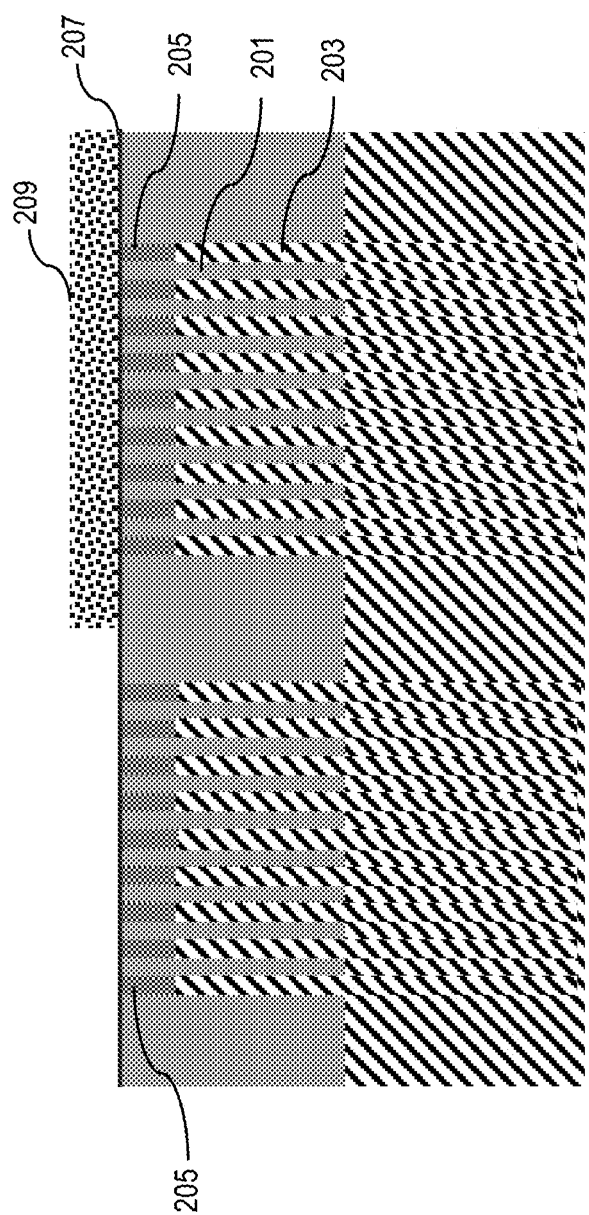
Figure 2D:
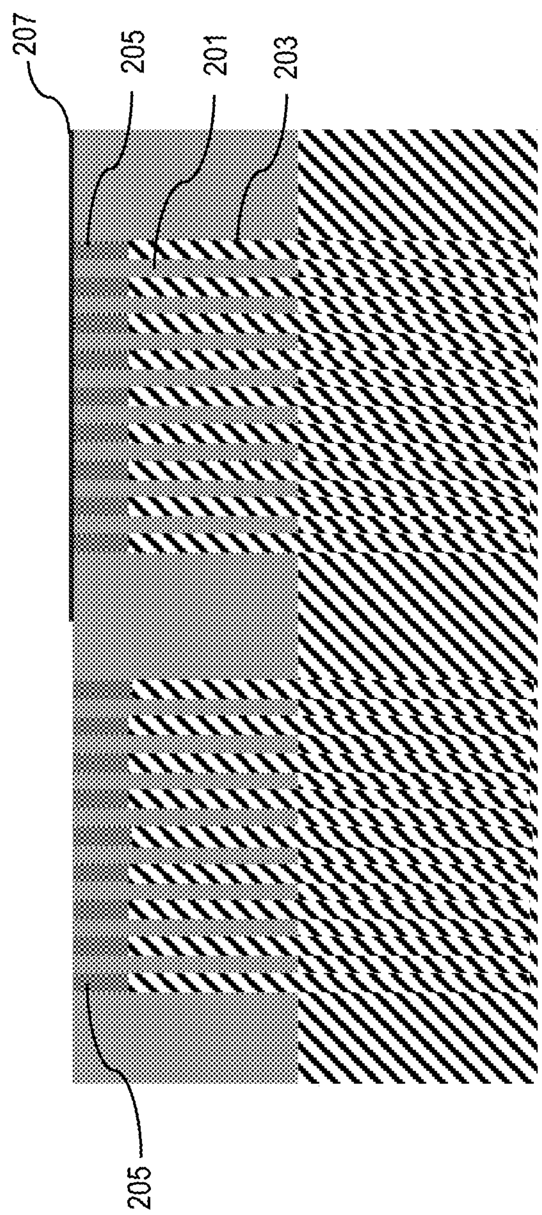
Figure 2E:
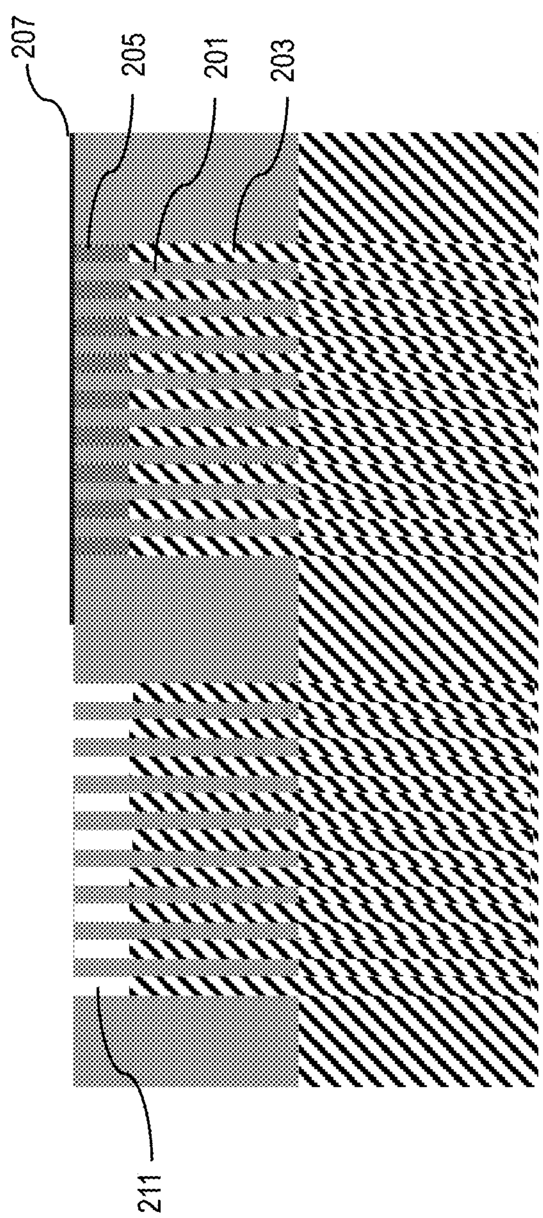
Figure 2F:
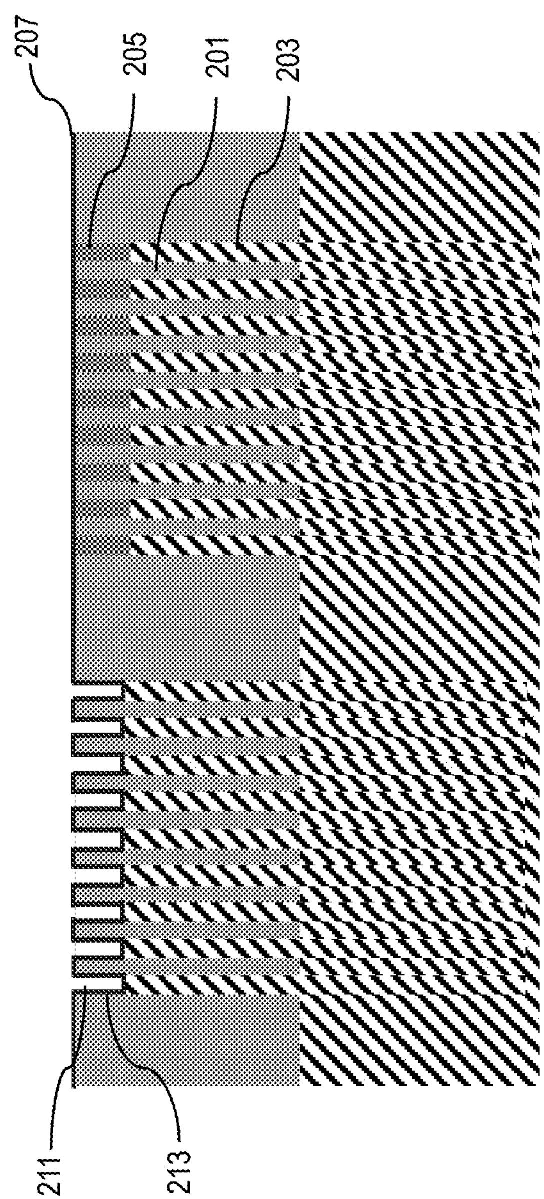
Figure 2G:
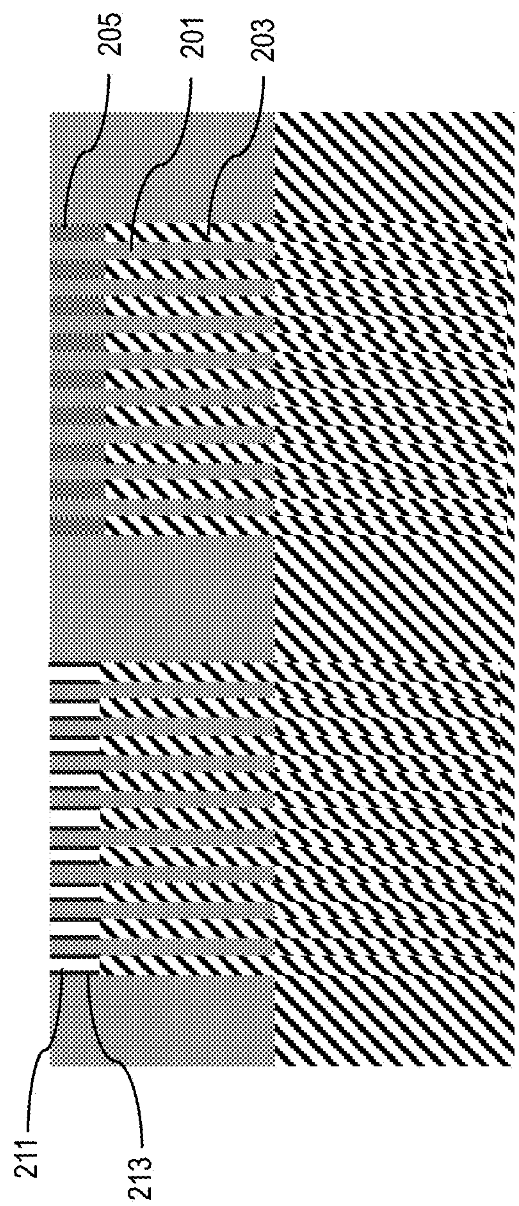
Figure 2H:
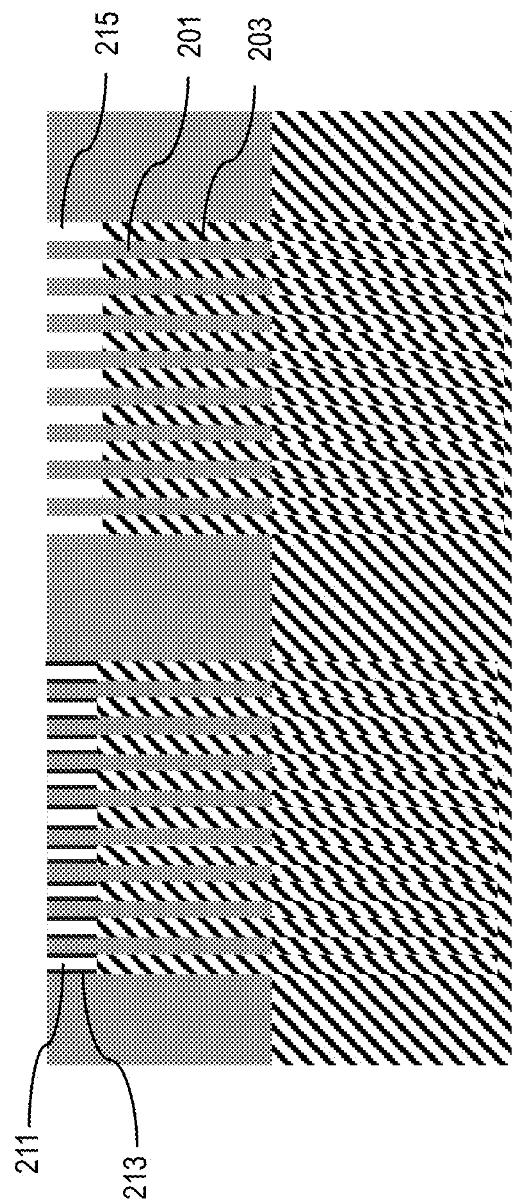
Figure 2I:
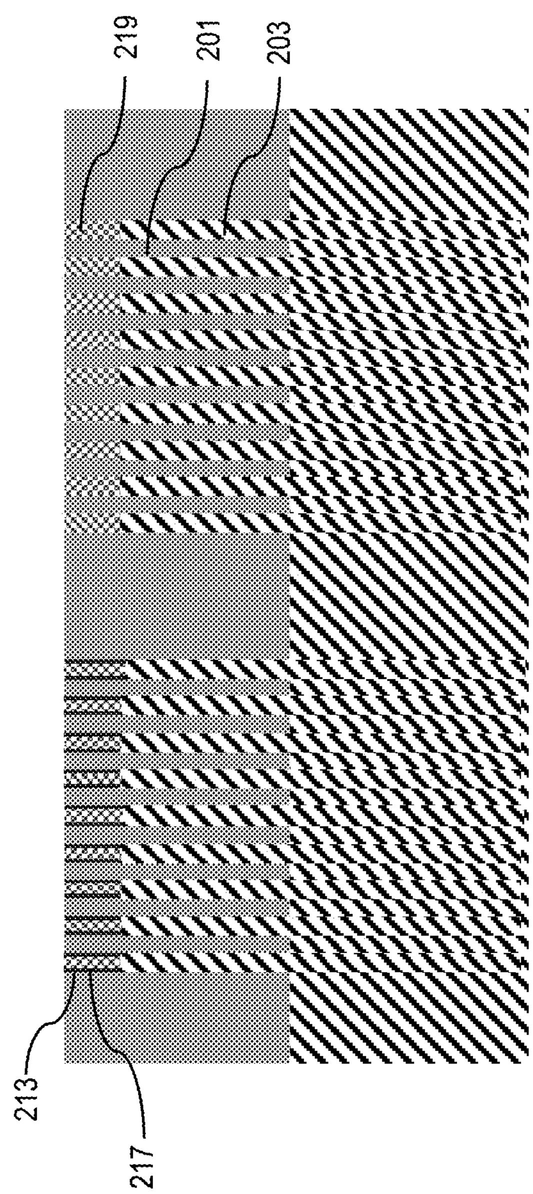
Figure 2J:
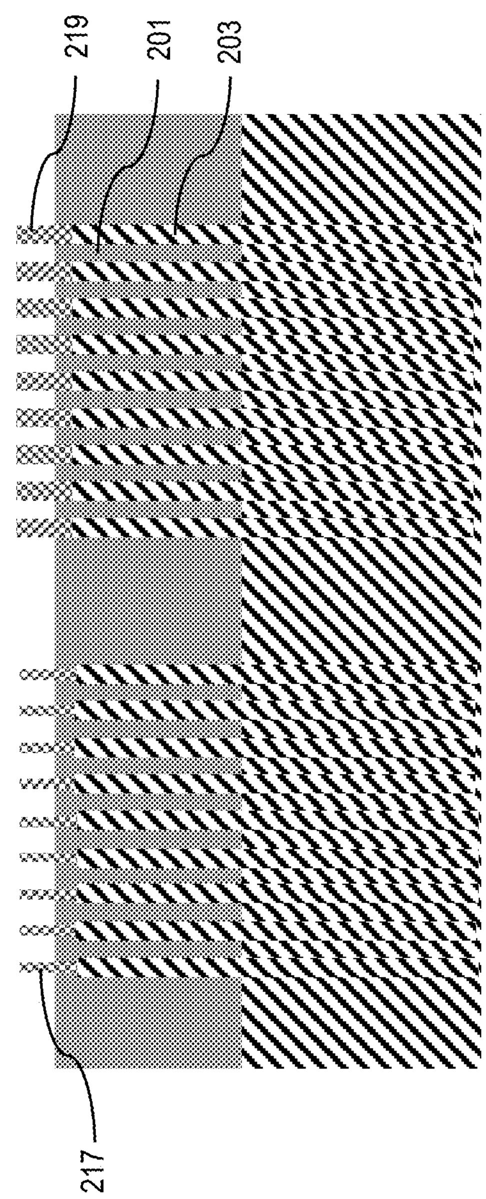

FIGS. 2A through 2J schematically illustrate a process flow for forming fins having differential widths and a straight profile, in accordance with an exemplary embodiment. Adverting to FIG. 2A, after STI CMP, STI regions 201 are separated by Si regions 203, each topped with a hardmask 205, similar to the embodiment of FIGS. 1A through 1F. The hardmask 205 is formed of SiN. The hardmask 205 has a width of 5 nm to 25 nm, defined by the fin pitch/width, and a thickness of 20 nm to 60 nm, depending on the patterning stack requirement. Next an oxide mask 207 is deposited over the STI regions 201 and hardmasks 205, as illustrated in FIG. 2B. The Si regions and intervening STI regions are divided into two areas, a first device area, for example a core (SG) device area, and a second device area, for example an input/output (EG) device area. A photoresist is formed over the second device area, as illustrated in FIG. 2C, and the oxide mask 207 over the first device area is removed, as shown in FIG. 2D. The oxide mask 207 is deposited to a thickness of 3 nm to 5 nm by chemical vapor deposition (CVD) or high temperature oxidation (HTO) and is removed by etching, e.g. dry etching. Once the oxide mask 207 is removed from the first device area, the photoresist 209 is also removed. Subsequently, as illustrated in FIG. 2E, the hardmask 205 is removed by any SiN removal process selective to oxide, for example, a dry etch or a $H_3PO_4$ etch, forming recesses 211 between the STI regions 205 in the first device area. Then, a spacer layer 213 having a thickness of 3 nm to 5 nm is conformally formed over the STI regions 201 and in the recesses 211 in the first device area, as depicted in FIG. 2F. As illustrated in FIG. 2G, horizontal portions of the spacer layer 213 and the remainder of oxide mask 207 are removed by a dry etch. Then, in FIG. 2H, the hardmasks 205 in the EG device area are removed, forming recesses 215. As illustrated in FIG. 2I, Si is epitaxially grown concurrently in the recesses 211 and 215 to form fins 217 and fins 219, respectively. The fins 217 may have a width of 5 nm to 12 nm (e.g. for SG fins), and the fins 219 may have a width of 8 nm to 25 nm (e.g. for EG fins). Then, as illustrated in FIG. 2J, the STI regions 201 and a remainder of the spacer layer 213 are etched to reveal the fins 217 and fins 219.

The embodiments of the present disclosure can achieve several technical effects, such as preventing fin bending during STI fill and annealing, and forming fins with a straight profile either with a uniform narrow width or with differential widths. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated finFET semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:

providing shallow trench isolation (STI) regions separated by silicon (Si) regions, each topped with a hardmask;

planarizing the STI regions;

removing the hardmask over a portion of the Si regions, forming recesses;

forming a conformal spacer layer over the STI regions and in the recesses;

removing horizontal portions of the spacer layer;

epitaxially growing Si in each recess, forming fins; and etching the STI regions and a remainder of the spacer layer down to the Si regions to reveal the fins.

2. A method according to claim 1, comprising planarizing the STI regions by chemical mechanical polishing (CMP).

3. A method according to claim 1, wherein the hardmask comprises silicon nitride (SiN).

4. A method according to claim 1, wherein the portion of the Si regions form NFET and PFET regions.

5. A method according to claim 1, wherein the hardmask has a width of 5 nm to 25 nm and a thickness of 20 nm to 60 nm.

6. A method according to claim 1, comprising forming the spacer layer to a thickness of 3 nm to 8 nm.

7. A method according to claim 1, further comprising:

forming a mask over a second portion of the Si regions prior to removing the hardmask over the first portion of the Si regions;

removing the mask over the second portion of the Si regions subsequent to removing the horizontal portions of the spacer layer, forming second recesses;

epitaxially growing Si in the second recesses concurrently with epitaxially growing Si in the first recesses to form second fins; and etching the STI regions and a remainder of the spacer layer to reveal the first fins and the second fins.

8. A method according to claim 7, wherein the first portion of the Si regions form portions of core (SG) devices and the second portion of the Si regions form portions of input/output (EG) devices.

9. A method according to claim 7, wherein the hardmask comprises silicon nitride (SiN).

10. A method according to claim 1, wherein the hardmask has a width of 5 nm to 25 nm and a thickness of 20 nm to 60 nm.

11. A method according to claim 7, comprising forming the spacer layer to a thickness of 3 nm to 8 nm.

* * * * *